United States Patent
Ma et al.

(10) Patent No.: US 8,043,981 B2
(45) Date of Patent: Oct. 25, 2011

(54) DUAL FREQUENCY LOW TEMPERATURE OXIDATION OF A SEMICONDUCTOR DEVICE

(75) Inventors: Kai Ma, Palo Alto, CA (US); Yoshitaka Yokota, San Jose, CA (US); Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/762,425

(22) Filed: Apr. 19, 2010

(65) Prior Publication Data
US 2010/0267247 A1   Oct. 21, 2010

Related U.S. Application Data

(60) Provisional application No. 61/171,111, filed on Apr. 21, 2009.

(51) Int. Cl.
*H01L 21/461* (2006.01)
*H01L 21/302* (2006.01)
*H01L 21/469* (2006.01)
*H01L 21/31* (2006.01)

(52) U.S. Cl. ........ 438/788; 438/709; 438/758; 438/770; 438/771; 438/784; 257/E21.079; 257/E21.274; 257/E21.282; 257/E21.301

(58) Field of Classification Search ........... 257/E21.079, 257/E21.282, E21.301, E21.274
See application file for complete search history.

(56) References Cited

U.S. PATENT DOCUMENTS

| | | | |
|---|---|---|---|
| 4,579,618 A | 4/1986 | Celestino et al. | |
| 6,607,675 B1 * | 8/2003 | Hsieh et al. | 216/67 |
| 7,004,107 B1 | 2/2006 | Raoux et al. | |
| 7,141,514 B2 | 11/2006 | Chua | |
| 7,214,628 B2 | 5/2007 | Chua | |
| 7,381,595 B2 | 6/2008 | Joshi et al. | |
| 7,431,857 B2 | 10/2008 | Shannon et al. | |
| 7,446,023 B2 | 11/2008 | Joshi et al. | |
| 7,645,709 B2 | 1/2010 | Chua et al. | |
| 2004/0018739 A1 * | 1/2004 | Abooameri et al. | 438/709 |
| 2008/0210550 A1 * | 9/2008 | Walther et al. | 204/192.15 |
| 2008/0236750 A1 | 10/2008 | Koshimizu | |
| 2009/0065351 A1 * | 3/2009 | Nuss | 204/192.15 |

OTHER PUBLICATIONS

Lim, Kwan-Yong et al., "High Reliable and Scalable Tungsten Polymetal Gate Process for memory Devices Using Low-Temperature Plasma Selective Gate Reoxidation", *Symposium on VLSI Technology Digest of Technical Papers* 2006, 2 pgs.

* cited by examiner

*Primary Examiner* — Mohsen Ahmadi
(74) *Attorney, Agent, or Firm* — Diehl Servilla LLC

(57) ABSTRACT

Methods and apparatus for forming an oxide layer on a semiconductor substrate are disclosed. A two frequency plasma source is used to form a plasma in a plasma reactor. In various embodiments, different quantities of power are supplied to a power source operating at the first frequency and a power source operating at the second frequency over time.

26 Claims, 3 Drawing Sheets

DUAL FREQUENCY LOW TEMPERATURE OXIDATION OF A SEMICONDUCTOR DEVICE

CROSS REFERENCE TO RELATED APPLICATION

This application claims the benefit of priority under 35 U.S.C. §119(e) to U.S. Patent Application No. 61/171,111, filed Apr. 21, 2009, which is hereby incorporated by reference in its entirety.

FIELD OF THE INVENTION

Embodiments of the present invention generally relate to semiconductor fabrication, and more particularly, to oxidation of a semiconductor device or its components.

BACKGROUND OF THE INVENTION

Semiconductor devices typically require thin oxide layers to be formed at various stages of their fabrication. For example, in transistors, a thin gate oxide layer may be formed as part of a gate stack structure, including sidewalls, as will be described further below. In addition, in some applications, such as in the fabrication of a flash memory film stack, a thin oxide layer may be formed surrounding the entire gate stack, for example, via exposing the stack to an oxidation process. Such oxidation processes have conventionally been performed either thermally or using a plasma.

Thermal processes for forming oxide layers, for example, the gate oxide layer or the gate stack oxidation layer, have worked relatively well in fabrication of semiconductor devices of the larger feature sizes used in the past. Unfortunately, as feature sizes are becoming much smaller and different oxides are employed in the next generation of advanced technologies, the high wafer temperatures often required in thermal oxidation processes are problematic in that the dopants in the silicon wafer (well doping and junctions) diffuse at the higher temperatures (e.g., above about 700° C.). Such a distortion of the dopant profiles and other features can lead to poor device performance or failure.

Plasma processes used to form oxide layers have similar problems. For example, at high chamber pressure (e.g., 100 mTorr), contaminants tend to accumulate in the gate oxide layer during formation, leading to fatal defects in the gate oxide structure such as dangling bonds or mobile charge, and at low chamber pressure (e.g., tens of mTorr), increased plasma ion energy leads to ion bombardment damage and other diffusion problems. For example, conventional oxidation processes often result in a defect known as a bird's beak. Bird's beak refers to diffusion of the oxide layer into the layers of the film stack structure from the sides at the interface between adjacent layers, rounding off the corners of the adjacent layers. The resultant defect has a profile that resembles a bird's beak. The intrusion of the oxide layer into the active region of the memory cell (e.g., in flash memory applications) reduces the active width of the memory cell, thereby undesirably reducing the effective width of the cell and degrading the performance of the flash memory device.

Another limitation of current low temperature plasma processes is that oxidation appears to occur preferentially on surfaces parallel to the wafer plane, namely, the top of the stack and bottom of trenches. It is believed that this is due to the flux of oxygen ions and radicals perpendicular to the wafer. Regardless of the cause, limited oxidation occurs on the sidewalls of the stacks, resulting in an unacceptably thin sidewall layer on the gate stacks. Thus, there is a need for an improved method for forming oxide layers on semiconductor substrates.

SUMMARY

One embodiment of the present invention relates to a method of forming an oxide layer on a semiconductor substrate comprising placing the substrate on a substrate support in a vacuum chamber of a plasma reactor, introducing a gas containing oxygen into the chamber, supplying power to a power source operating at the first frequency to generate a first plasma in the chamber, supplying power to the power source operating at the second frequency to generate a second plasma in the chamber, wherein the second frequency is greater than the first frequency, and forming the oxide layer on the semiconductor substrate. As used herein, the first frequency may be referred to as low-frequency, and the second frequency may be referred to as a high-frequency. Thus, as used herein, the terms "low-frequency" and "high-frequency" refer to the relative operative frequencies of the two power sources associated with the plasma reactor.

In one embodiment, constant power is maintained to the high-frequency power source during oxide layer formation. In one embodiment, more power is supplied to the high-frequency power source than is supplied to the low-frequency power source. In one or more embodiments, substantially constant power is supplied to the low-frequency power source during oxide layer formation.

In one embodiment of the invention, the process is used to form an oxide layer on a gate electrode including a pair of sidewalls. The power supplied at the low-frequency power source and at the high-frequency power provides sufficient energy to cover the sidewalls and prevent damage to the substrate.

In one embodiment, in a first step, no power is supplied at the low-frequency while power is supplied at the high-frequency, and in a second step, power is supplied at both frequencies. In another embodiment, in a first step, no power is supplied at the low-frequency while no power is supplied at the high-frequency, and in a second step, substantially constant power is supplied at both frequencies.

In one or more embodiments, the power is gradually increased at the low-frequency and substantially constant power is supplied at the high-frequency. In another embodiment, in a first step, no power is supplied at the low-frequency while power is supplied at the high-frequency, and in a second step, power is gradually increased at the low-frequency while constant power is supplied at the high-frequency, and in a third step, substantially constant power is supplied at both frequencies. The power may be supplied to a single power source that utilizes a power divider such as an adjustable capacitor or two separate power sources may be used.

Another embodiment of the invention pertains to supplying substantially constant power at the high-frequency and ramping up power at the low-frequency at a targeted rate to increase deposition of oxide on the sidewalls of the gate electrode.

An example of a low-frequency is in the range of about 10 kHz and 14 MHz. An example of a high-frequency is in the range of about 1 MHz and 5 GHz. The power source(s) may be coupled to an apparatus selected from a RF inductive plasma apparatus, a radial-line slot antenna plasma apparatus or a hollow cathode plasma apparatus.

The foregoing has outlined rather broadly certain features of the present invention. It should be appreciated by those skilled in the art that the specific embodiments disclosed may be readily utilized as a basis for modifying or designing other structures or processes within the scope of present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide methods for low temperature oxidation of semiconductor substrates. As used herein, low temperature oxidation refers to oxidation at temperatures below about 700° C. It has been found that the application of a dual frequency source plasma to a plasma reactor can enhance growth of oxides on sidewalls of a stack of oxide layers grown on a semiconductor substrate, resulting in thicker oxide layers on the sidewalls than observed with the application of a single frequency source plasma.

Figure 1:
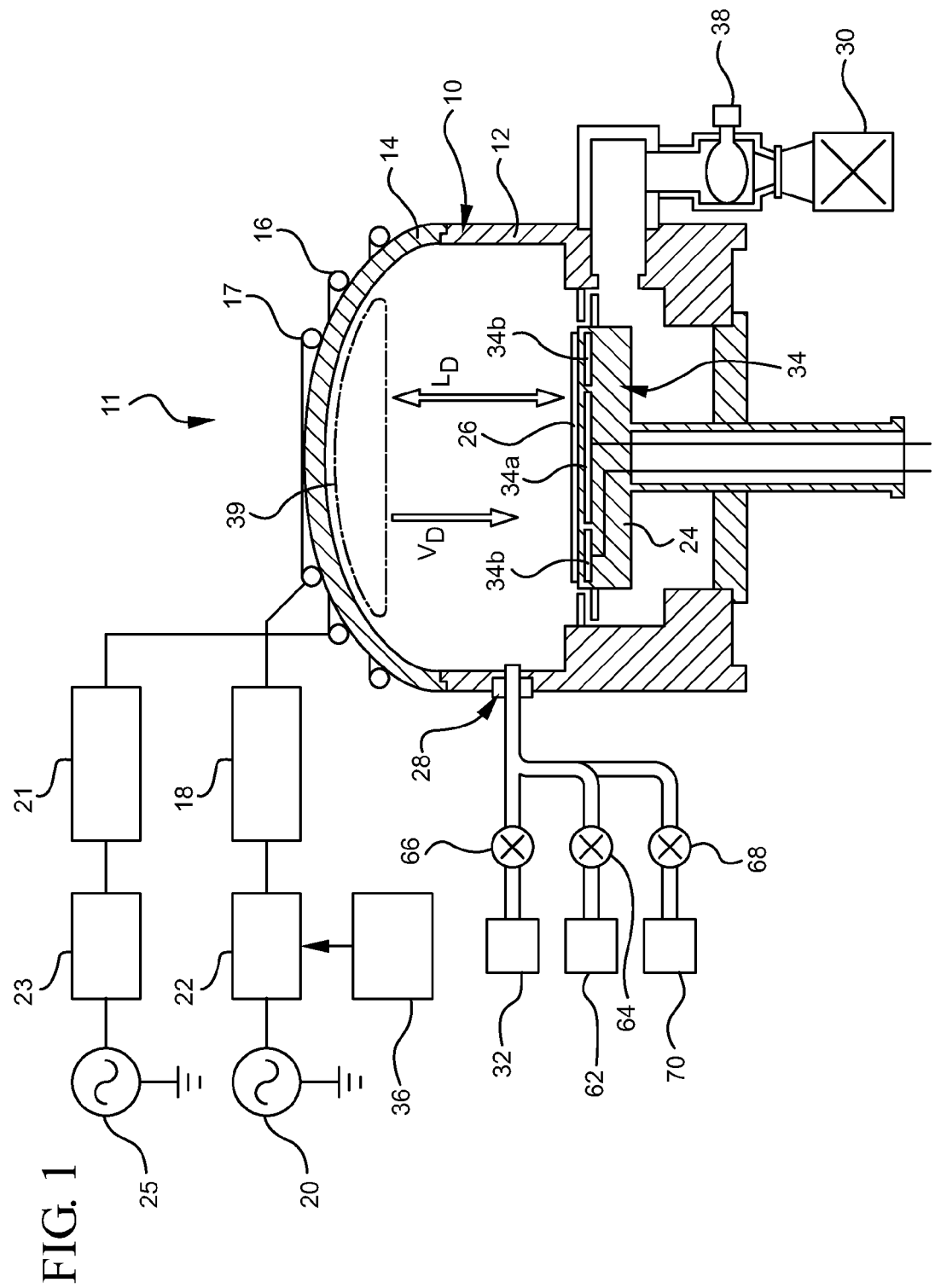
FIG. 1 illustrates a plasma reactor according to an embodiment of the invention.

Embodiments of the present invention may be carried out in suitably equipped plasma reactors, such as Decoupled Plasma Nitridation (DPN) reactors available from Applied Materials, Inc., of Santa Clara, Calif. Other suitable plasma reactors may also be utilized, including, but not limited to a radial line slot antenna plasma apparatus and a hollow cathode plasma apparatus. FIG. 1 depicts an illustrative plasma reactor suitable for carrying out oxide formation processes in accordance with embodiments of the present invention. The reactor may provide a low ion energy plasma and a high ion energy plasma via inductively coupled plasma source power applicators driven by continuous wave (CW) power generators.

The reactor 11 shown in FIG. 1 includes a vacuum chamber 10 having a cylindrical side wall 12 and a ceiling 14 which may be either dome-shaped (as shown in the drawing), flat, or another geometry. A first plasma source power applicator comprises a coil antenna 16 disposed over the ceiling 14 and coupled through a first impedance match network 21 to a low-frequency power source. The low-frequency power source comprises an RF power generator 25 and a gate 23 at the output of the generator 25. A second plasma source power applicator comprises a coil antenna 17 disposed over the ceiling and coupled through a second impedance match network 18 to a high-frequency power source. The high-frequency power source consists of an RF power generator 20 and a gate 22 at the output of the generator 20. It will be understood that other apparatus can be used to provide a dual frequency plasma. For example, a single power source can be used, and an appropriate device to split power to the power applicators such as an adjustable capacitor.

The reactor 11 also includes a substrate support pedestal 24, which may be an electrostatic chuck or other suitable substrate support, for holding a semiconductor substrate 26 such as a 200 mm or 300 mm semiconductor wafer or the like. An optional heating apparatus such as a heater 34 beneath the top surface of the substrate support pedestal 24. The heater 34 may be a single or multiple zone heater, such as a dual radial zone heater having radial inner and outer heating elements 34a and 34b, as depicted in FIG. 1.

In addition, the reactor includes a gas injection system 28 and a vacuum pump 30 coupled to the interior of the chamber 10. The gas injection system 28 is supplied by one or more process gas sources such as, for example, an oxygen container 32, a hydrogen container 62 or a noble gas container 70. Other process gas sources may be included, such as a water vapor source and an inert gas source (not shown). Flow control valves 66, 64 and 68 are coupled to the oxygen container 32, the hydrogen container 62 and the noble gas container 70, respectively, and may be utilized to selectively provide process gases or process gas mixtures to the interior of the chamber 10 during processing. Other gas sources (not shown) for providing additional gases such as nitrogen, gaseous mixtures, or the like may also be provided. The pressure inside the chamber 10 may be controlled by a throttle valve 38 of the vacuum pump 30.

Plasma is generated in an ion generation region 39 corresponding to a volume under the ceiling 14 surrounded by the coil antennas 16 and 17. As the plasma is formed in an upper region of the chamber 10 at a distance from the substrate 26, the plasma is referred to as a quasi-remote plasma (e.g., the plasma has benefits of remote plasma formation, but is formed within the same chamber 10 as the substrate 26.) In operation, the plasma reactor may be employed to carry out oxidation processes in accordance with embodiments of the present invention to deposit high quality oxide layers having increased oxide layers on sidewalls of oxide stacks formed on a substrate. Alternatively, a remote plasma may be utilized, in which case the ion generation region may be disposed outside of the chamber. The processes may be performed at a reduced temperature which limits diffusion, which may aid in minimizing bird's beak type defects.

Figure 2A:
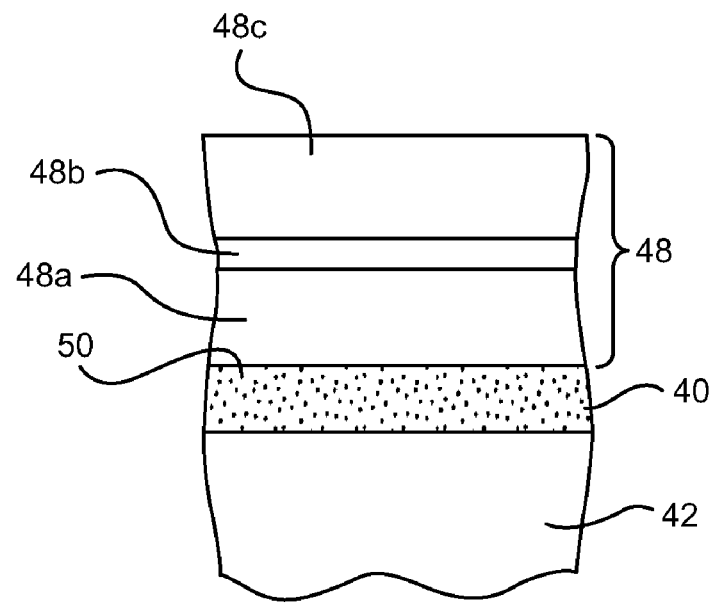
FIGS. 2A-2B illustrate sequential changes in a semiconductor structure during a process according to an embodiment of the invention.

In accordance with one or more embodiments of the present invention, methods and apparatus can be used to form oxide layers in a stack, for example, gate oxide stacks. FIG. 2A depicts a semiconductor device including a thin insulating gate oxide layer 40 formed over a semiconductor substrate 42 corresponding to the wafer 26 of FIG. 1. The substrate may be supported in the plasma reactor described above with respect to FIG. 1.

The substrate 42 may be a variety a shapes and dimensions, for example, in the shape of a substantially circular wafer with a 200 or 300 mm diameter. Alternatively, the wafers may be other shapes such as rectangular or square. The substrate 42 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

In some embodiments, the film stack 48, which, in the embodiment shown, is a gate electrode film stack 48, may be formed upon the substrate 42 and then provided to the chamber 10 for the oxidation process. For example, the film stack 48 may be fabricated in one or more process chambers coupled to a cluster tool that also has the plasma reactor 10 coupled thereto. One example of a suitable cluster tool is a Gate Stack CENTURA®, available from Applied Materials, Inc., of Santa Clara, Calif.

A gate electrode film stack 48 overlies the gate oxide layer 40. The semiconductor substrate 42 may be silicon and the insulating gate oxide layer 40 may be silicon dioxide. The electrode 48 may be the gate of a transistor that includes source and drain regions formed later in the substrate 42 during a subsequent fabrication step. As is well known, charge carriers (electrons or holes) flow beneath the gate 48 and between the source and drain. If the silicon dioxide structure in the gate oxide layer 40 has defects 50 giving rise to incomplete or dangling bonds, then the electric fields associated with those dangling bonds can perturb the flow of charge carriers, thereby impeding device performance. Such defects can arise in a thermal oxide growth process when the formation of the gate oxide layer 40 is carried out at too low a temperature (e.g., below about 700° C.). Such defects can be produced in either a thermal oxide growth process or in a plasma oxide formation process with incomplete bonding within the insulating gate oxide layer 40.

The gate electrode film stack 48 may consist entirely of polysilicon. Alternatively, the gate electrode film stack 48 may be a stacked structure of multiple layers as shown in FIG. 2A including a polysilicon base layer 48a, a tungsten nitride diffusion barrier layer 48b and a tungsten layer 48c.

Plasma processing can be used to form the silicon dioxide gate insulator layer 40 at relatively low temperatures (e.g., below about 700° C.). Specifically, a plasma formed of oxygen gas can cause silicon oxide to grow on exposed portions of the substrate 42 to form the gate insulator layer 40. Reduction in chamber pressure of a RF inductive reactor increases productivity because the oxide growth rate increases as chamber pressure is reduced. Therefore, the plasma oxide growth process can be performed at a reduced chamber pressure (e.g., on the order of about 10 mT) to enhance productivity.

According to one or more embodiments of the present invention, Enhanced productivity of silicon oxide can be achieved by reducing the chamber pressure to very low levels (in the range of about 1 mTorr-500 mTorr). In certain embodiments, the chamber pressure is on the order of about 10 mTorr in a RF inductive reactor.

Figure 2B:
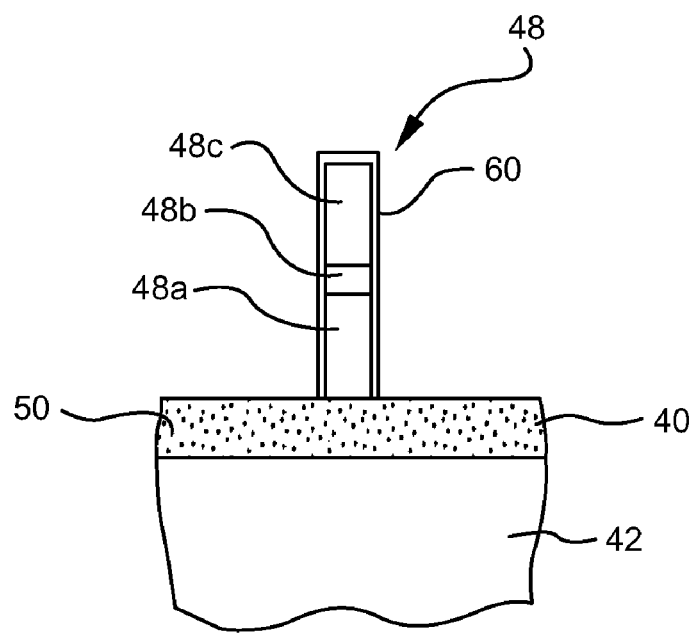

Dynamic random access memories (DRAMs) have a gate structure in which the gate insulator layer 40 of FIG. 2A is silicon dioxide and the gate electrode 48 is a layered structure having a polysilicon base layer 48a, a tungsten nitride diffusion barrier layer 48b and a tungsten layer 48c. One problem with tungsten is that it oxidizes very rapidly. The gate electrode film stack 48 of FIG. 2A can be photolithographically etched to define a gate having the desired width and length as shown in FIG. 2B. This exposes the side walls of the tungsten layer 48c. After formation of the gate stack, an oxide layer 60 is formed, covering the gate electrode film stack, including the sidewalls utilizing the plasma oxidation process described herein.

It will be understood that the gate electrode film stack 48 is not limited to the particular materials described above. Thus, the film stack 48 may be any stack of materials to be oxidized. For example, in some embodiments, such as in flash memory applications, the gate electrode film stack 48 may be stack of a flash memory cell comprising a tunnel oxide layer, a floating gate layer, a single or multi-layer dielectric layer comprising the Interpoly Dielectric (IPD) (a non-limiting example of the IPD is a multi-layer ONO layer comprising an oxide layer, a nitride layer, an oxide layer, and a control gate layer. In such structures, the oxide layers typically comprise silicon and oxygen, such as silicon oxide ($SiO_2$), silicon oxynitride (SiON), or the like. The nitride layer typically comprises silicon and nitrogen, such as silicon nitride (SiN), or the like. In some embodiments, a multi-layer comprising $SiO_2/Al_2O_3/SiO_2$ can also be used as the IPD layer. The floating gate layer and the control gate layer typically comprise a conductive material, such as polysilicon, metals, or the like. It is contemplated that film stacks in other applications may be advantageously oxidized in accordance with the teachings provided herein, such as dynamic random access memory (DRAM) metal electrode/polysilicon gate stacks, Charge Trap Flash (CTF) for Non-volatile Memory (NVM), or the like. The DRAM metal electrode is typically tungsten (W) with interlayers of titanium nitride (TiN) or tungsten nitride (WN) between the tungsten and polysilicon layers. Charge Trap Flash (CTF) for Non-volatile Memory (NVM) uses a $SiO_2/SiN/Al_2O_3$ gate stack with a metal electrode of tantalum nitride (TaN) or titanium nitride (TiN) that may also benefit from sidewall oxidation after gate etch.

A plasma is generated in the plasma chamber 10 to form an oxide layer 60 on the gate electrode film stack 48. A plasma can be generated by flowing a suitable process gas, which may comprise hydrogen, oxygen, helium, water vapor and combinations thereof into the chamber 10. In some embodiments, the process gas flowed into the chamber 10 includes oxygen ($O_2$) and hydrogen ($H_2$). In some embodiments, the hydrogen ($H_2$) may be less than about 95 percent, or up to about 75 percent of the total amount of oxygen ($O_2$) and hydrogen ($H_2$) provided.

In some embodiments, the process gas (or gas mixture) may be provided at total flow rate of between about 100-2000 sccm, or at about 400 sccm. For example, in embodiments where both oxygen ($O_2$) and hydrogen ($H_2$) are provided, the oxygen ($O_2$) and hydrogen ($H_2$) may be provided in a total flow rate of between about 100-2000 sccm, or at about 400 sccm, in the percentage ranges described above. In embodiments where water vapor is provided, the water vapor may be introduced at a flow rate of between about 5-1000 sccm with one or more inert carrier gases such as helium, argon, krypton, neon or other suitable inert gases. The inert gases may be provided as necessary to provide a total flow rate of between about 100-2000 sccm. Inert gas additions may also be used with the $H_2/O_2$ mixture to prevent recombination of the ionized oxygen and/or hydrogen. Excited diatomic molecules typically like to recombine with themselves in a plasma, so the addition of inert gases (such as Ar, He, Kr, Ne, or the like) may facilitate higher oxidation rates.

Referring again to FIG. 1, in an embodiment of the method of the present invention involves first placing the substrate 26 including the gate electrode film stack 48 on the substrate support pedestal 24. One or more gases or gas mixtures from the oxygen container 32, the hydrogen container 62, and the noble gas container 70 (or a water vapor container) is then introduced into the chamber 10. High-frequency power from the RF power generator 20 and gate 22, and low-frequency power from the power generator 25 and gate 23, are provided to the reactor and generate a first plasma and a second plasma within the chamber 10 to form an oxide layer 60 over the gate electrode film stack 60. As discussed above, the plasma can be formed using any suitable plasma apparatus such as a RF inductive plasma apparatus, a radial-line slot antenna plasma apparatus or a hollow cathode plasma apparatus. In the embodiment shown in FIG. 1, the plasma is generated in the ion generation region 39 of the chamber via inductive coupling of RF energy from the coil antenna disposed over the ceiling 14, providing ion energy. It may be desirable to provide a low ion energy (for example, less than bout 5 eV for pulsed plasmas and less than about 15 eV for CW plasmas to limit ion bombardment damage and facilitate oxidation of the sidewalls of the stack 48. Applicants have determined that by using a dual frequency plasma, oxidation of the sidewalls of the stack 40 can be enhanced. According to certain embodiments of the invention, the low-frequency power source has a range of about 10 kHz and 14 MHz, and the high-frequency power source has a range of about 1 MHz and 5 GHz.

Figure 3A:
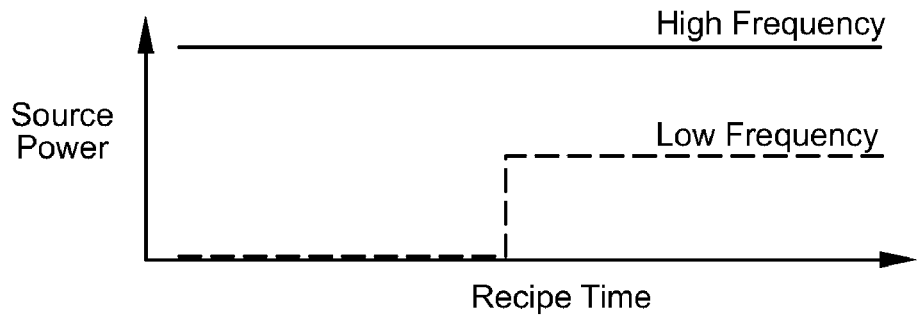
FIGS. 3A-3D illustrate exemplary power supply schematics in accordance with various embodiments.

According to embodiments of the present invention, the film can be formed in a single step with two frequencies, where their source power is adjusted to give sufficient sputter energy to adequately cover the sidewall of the stack 48, but not too much low frequency power to damage the Si substrate. Thus, the first or high-frequency power would be operated at a higher power than the second or lower frequency power. More specifically, as the oxide film is formed in two steps, the power at the lower frequency is minimized in a first step, to minimize damage to the Si substrate. In a second step, a higher power is applied at the low frequency to increase the sputtering component and fraction of ions arriving at the sidewall with greater energy to get past the saturation in sidewall thickness as shown schematically in FIG. 3A.

Figure 3B:
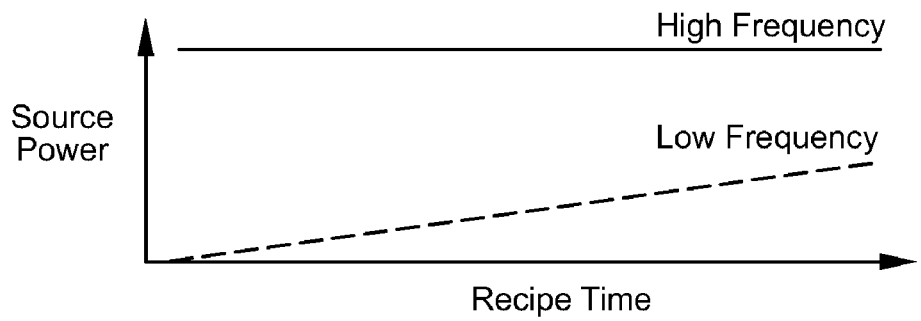
Figure 3C:
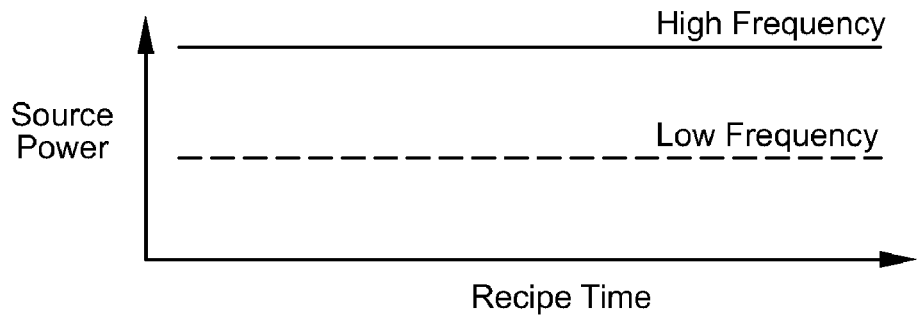

Other variants of a dual frequency plasma scheme can be used to optimize deposition on the sidewalls and minimize damage to the substrate. For example in FIG. 3B, power at the lower frequency is ramped up to increase the sputtering component and fraction of ions arriving at the sidewall with greater energy, while power at the high frequency remains constant. In another variant, shown in FIG. 3C, power at both the low and high frequency is substantially constant during the oxidation process.

Figure 3D:
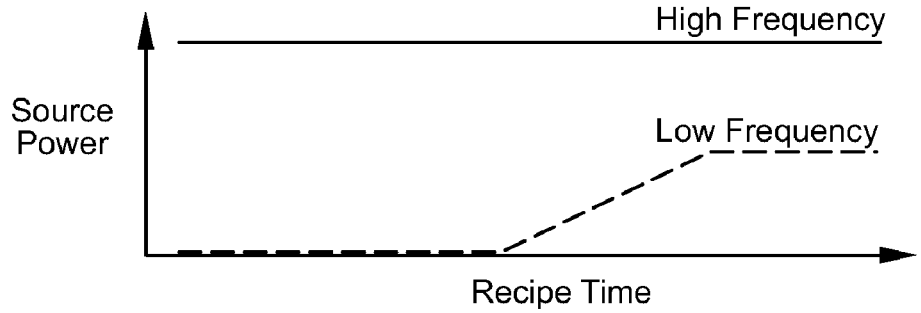

In yet another variation shown in FIG. 3D, the power at the lower frequency is initially set at zero, gradually ramped up in a second step, and held in a third step to increase the sputtering component and fraction of ions arriving at the sidewall with greater energy. Other variants in the frequency and power supply scheme are within the scope of the invention. For example, the power at the lower frequency can be ramped up using any function form where the first derivative is positive to increase the sputtering component and fraction of ions arriving at the sidewall with greater energy.

According to embodiments of the invention, the plasma may be generated in a continuous wave or a pulsed mode with duty cycles of between about 2 to 70 percent. For example, in some embodiments, the plasma may be generated during successive "on" times, and ion energy of the plasma allowed to decay during successive "off" intervals. The "off" intervals separate successive "on" intervals and the "on" and "off" intervals define a controllable duty cycle. The duty cycle limits kinetic ion energy at the surface of the substrate below a pre-determined threshold energy. In some embodiments, the pre-determined threshold energy is at or below about 5 eV.

For example, during the "on" time of the pulsed RF power, the plasma energy increases and during the "off" time it decreases. During the short "on" time, the plasma is generated in the ion generation region 39. The ion generation region 39 is elevated a significant distance LD above the substrate 26. Plasma generated in the ion generation region 39 near the ceiling 14 during the "on" time drifts at an average velocity VD toward the substrate 26 during the "off" time. During each "off" time, the fastest electrons diffuse to the chamber walls, allowing the plasma to cool. The most energetic electrons diffuse to the chamber walls at a much faster velocity than the plasma ion drift velocity VD. Therefore, during the "off" time, the plasma ion energy decreases significantly before the ions reach the substrate 26. During the next "on" time, more plasma is produced in the ion generation region 39, and the entire cycle repeats itself. As a result, the energy of the plasma ions reaching the substrate 26 is significantly reduced. At the lower range of chamber pressure, namely around 10 mT and below, the plasma energy of the pulsed RF case is greatly reduced from that of the continuous RF case.

The "off" time of the pulsed RF power waveform and the distance LD between the ion generation region 39 and the substrate 26 should both be sufficient to allow plasma generated in the ion generation region 39 to lose a sufficient amount of its energy so that it causes little or no ion bombardment damage or defects upon reaching the substrate 26. Specifically, the "off" time is defined by a pulse frequency between about 2 and 20 kHz, or at about 10 kHz, and an "on" duty cycle between about 5% and 20%. Thus, in some embodiments, the "on" interval may last between about 5-50 microseconds, or about 20 microseconds and the "off" interval may last between about 50-95 microseconds, or about 80 microseconds.

In some embodiments, the ion generation region-to-substrate distance LD is greater than about 2 cm, or between about 2-20 cm. The ion generation region-to substrate distance LD can be about the same as (or greater than) the distance VD times the "off" time traveled by the plasma ions during a single "off" time of the pulsed RF power waveform.

The plasma generated may be formed in a low pressure process, thereby reducing the likelihood of contamination induced defects. For example, in some embodiments, the chamber 10 may be maintained at a pressure of between about 1-500 mTorr. Moreover, ion bombardment-induced defects that would be expected at such a low chamber pressure levels may be limited or prevented by using the quasi-remote plasma source and, optionally, by pulsing the plasma source power as described above.

Upon forming the oxide layer 60 to a desired thickness over the film stack 48, the process ends. The substrate 26 may be subsequently further processed as necessary to complete the structures being fabricated thereon During the oxidation process, the substrate 42 may be maintained at about room temperature (about 22° C.), at a temperature in the range of about 20° C.-750° C., less than about 700° C., or less than about 600° C. The low temperature of the process reduces the ion energy of the plasma constituents, thereby further limiting diffusion of oxygen between the layers of the gate structure 48 and further reducing bird's beak.

The oxide layer may be formed to a thickness in the range of 5 Angstroms-100 Angstroms. The process may provide growth rates of oxide films in the range of about 7-50 Angstroms per minute, or at least about 25 Angstroms per minute. The inventive process disclosed herein provides the oxide growth rate enhancement described above at a lower thermal budget, thereby further limiting diffusion effects by reducing the exposure time of the substrate to the process as compared to conventional oxidation processes. In some embodiments, the process may have a duration of between about 5 seconds-300 seconds.

Although the present invention is illustrated above with reference to a flash memory film stack, the present invention can also be used to advantage to oxidize other transistor gate stacks, other material stacks, or to form oxide layers on substrates in various other applications.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method of forming an oxide layer on a stack on a semiconductor substrate by low temperature plasma oxidation, comprising:
   placing the semiconductor substrate on a substrate support in a chamber of a plasma reactor;
   introducing a gas into the chamber, the gas consisting essentially of oxygen and an optional second gas selected from hydrogen, helium, argon, krypton, neon and xenon;
   supplying power to a power source operating at a first frequency to generate a first plasma containing ionized oxygen within the chamber;
   supplying power to a power source operating at a second frequency, wherein the second frequency is higher than the first frequency; and
   growing the oxide layer at a temperature below 700° C. on the stack on the semiconductor substrate by oxidizing the stack including a pair of sidewalls and the power supplied at the first frequency and the second frequency is selected to provide sufficient energy to cover the sidewalls and to prevent damage to the semiconductor substrate, wherein the oxide layer is formed in a first step in which no power is supplied at the first frequency while power is supplied at the second frequency and in a second step in which power is supplied at the first frequency and the second frequency.

2. The method of claim 1, wherein the power source operating at the first frequency is a separate power source from the power source operating at the second frequency.

3. The method of claim 1, wherein the power source operating at the first frequency is the same power source as the power source operating at the second frequency.

4. The method of claim 3, further comprising dividing the power between a first power applicator to generate a plasma at the first frequency and a second power applicator to generate a plasma at the second frequency.

5. The method of claim 4, wherein both the first and second power applicators comprise a coil antenna.

6. The method of claim 4, wherein both the first and second power applicators comprise a hollow cathode.

7. The method of claim 1, further comprising maintaining power at the second frequency at a substantially constant power during forming the oxide layer.

8. The method of claim 1, wherein more power is supplied at the second frequency than is supplied at the first frequency.

9. The method of claim 1, wherein the power supplied at the first frequency is substantially constant during forming the oxide layer.

10. The method of claim 1, wherein the power supplied at the first frequency and at the second frequency remains substantially constant during the second step.

11. The method of claim 1, wherein the process is used to form an oxide layer on a gate electrode including a pair of sidewalls and oxide layer is formed while power at the first frequency is gradually increased and substantially constant power is supplied at the second frequency.

12. The method of claim 1, wherein the process is used to form an oxide layer on a gate electrode including a pair of sidewalls and the power supplied at the second frequency is substantially constant and power supplied at the first frequency is ramped at a targeted rate to increase growth of oxide on the sidewalls.

13. The method of claim 1, wherein the first frequency operates in the range of about 10 kHz and 14 MHz.

14. The method of claim 13, wherein the second frequency operates in the range of about 1 MHz and 5 GHz.

15. The method of claim 1, wherein the plasma chamber comprises an apparatus selected from an RF inductive plasma apparatus, a radial-line slot antenna plasma apparatus, and a hollow cathode plasma apparatus.

16. The method of claim 1, further comprising varying at least one of the power to the power source, the first frequency and the second frequency.

17. The method of claim 16, wherein varying one or both of the power to the power source, the first frequency and the second frequency occurs during separate steps.

18. A method of forming an oxide layer on a stack on a semiconductor substrate by low temperature plasma oxidation, comprising:
   placing the semiconductor substrate on a substrate support in a chamber of a plasma reactor;
   introducing a gas into the chamber, the gas consisting essentially of oxygen and an optional second gas selected from hydrogen, helium, argon, krypton, neon and xenon;
   supplying power to a power source operating at a first frequency to generate a first plasma containing ionized oxygen within the chamber;
   supplying power to a power source operating at a second frequency, wherein the second frequency is higher than the first frequency; and
   growing the oxide layer at a temperature below 700° C. on the stack on the semiconductor substrate by oxidizing the stack including a pair of sidewalls and the power supplied at the first frequency and the second frequency is selected to provide sufficient energy to cover the sidewalls and to prevent damage to the semiconductor substrate, wherein the oxide layer is formed in a first step in which no power is supplied at the first frequency while power is supplied at the second frequency followed by a second step in which power at the first frequency is gradually increased and substantially constant power is supplied at the second frequency followed by a third step in which substantially constant power is supplied at the first frequency and the second frequency.

19. The method of claim 18, wherein the power source operating at the first frequency is a separate power source from the power source operating at the second frequency.

20. The method of claim 18, wherein the power source operating at the first frequency is the same power source as the power source operating at the second frequency.

21. The method of claim 20, further comprising dividing the power between a first power applicator to generate plasma at the first frequency and a second power applicator to generate a plasma at the second frequency.

22. The method of claim 21, wherein both the first and second power applicators comprise a coil antenna.

23. The method of claim 21, wherein both the first and second power applicators comprise a hollow cathode.

24. The method of claim 18, further comprising maintaining power at the second frequency at a substantially constant power during forming the oxide layer.

25. The method of claim 18, wherein more power is supplied at the second frequency than is supplied at the first frequency.

26. The method of claim 18 further comprising varying at least one of the power to the power source, the first frequency and the second frequency.

* * * * *